(12) United States Patent
Yoshioka

(10) Patent No.: US 7,527,442 B2
(45) Date of Patent: May 5, 2009

(54) PROCESS FOR FORMING RESIST PATTERN, AND RESIST COATING AND DEVELOPING APPARATUS

(75) Inventor: Hiroshi Yoshioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/872,055

(22) Filed: Oct. 15, 2007

(65) Prior Publication Data

US 2008/0088808 A1 Apr. 17, 2008

(30) Foreign Application Priority Data

Oct. 17, 2006 (JP) .............................. 2006-282386

(51) Int. Cl.
*G03D 5/00* (2006.01)
*G03C 5/00* (2006.01)
*H01L 21/00* (2006.01)

(52) U.S. Cl. .................... 396/611; 430/30; 430/311

(58) Field of Classification Search ................ 396/611; 355/27; 430/30, 311; 414/935, 937, 938, 414/940
See application file for complete search history.

(56) References Cited

U.S. PATENT DOCUMENTS 5,932,380 A * 8/1999 Yaegashi et al. .............. 430/30
6,799,910 B2 * 10/2004 Tateyama ................... 396/611
7,210,864 B2 * 5/2007 Higashi et al. .............. 396/611

FOREIGN PATENT DOCUMENTS

| JP | 01-225119 | 9/1989 |
| JP | 07-321023 | 12/1995 |
| JP | 2000-49084 | 2/2000 |
| JP | 2005-209855 | * 8/2005 |

OTHER PUBLICATIONS

English translation of JP 2005-209855 (dated Aug. 4, 2005).*
English translation of JP 2000-049084 (dated Feb. 18, 2000).*
English translation of JP 07-321023 (dated Dec. 8, 1995).*

* cited by examiner

*Primary Examiner*—Alan A Mathews
(74) *Attorney, Agent, or Firm*—Young & Thompson

(57) ABSTRACT

A process for forming a resist pattern according to the invention is a process for forming a resist pattern in which a photoresist is coated on a first substrate, the coated photoresist is exposed to light of a predetermined pattern, and afterwards developing is performed, wherein in at least one of the processes of coating, exposing, and developing, whenever lots to which the first substrate belongs change, the atmosphere residing in the lot is changed.

4 Claims, 7 Drawing Sheets

| PRIOR LOT | SUCCEEDING LOT | INFLUENCE ON RESIST PATTERN IN SUCCEEDING LOT |
|---|---|---|
| RESIST A | RESIST B | YES |
| RESIST A | RESIST C | NO |
| RESIST B | RESIST C | YES |
| RESIST B | RESIST D | NO |
| RESIST A | RESIST D | NO |

SEMICONDUCTOR SUBSTRATE NO. OF SUCCEEDING LOT

PROCESS FOR FORMING RESIST PATTERN, AND RESIST COATING AND DEVELOPING APPARATUS

BACKGROUND OF THE INVENTION

Priority is claimed on Japanese Patent Application No. 2006-282386, filed Oct. 17, 2006, the content of which is incorporated herein by reference.

1. Field of the Invention

The present invention relates to a process for forming a resist pattern, and a resist coating and developing apparatus. In particular, the present invention relates to a process for forming a resist pattern for controlling dispersion in the linewidth dimension of a resist pattern, and a resist coating and developing apparatus.

2. Description of the Related Art

Heretofore, in a semiconductor device manufacturing process, a resist pattern is used as a mask when etching silicon oxide, silicon nitride film or polysilicon film, or as a mask during ion implantation of conductive impurities in a wafer formed from silicon or the like. The resist pattern is formed by coating the surface of the wafer with photoresist, exposing the coated photoresist to light of a predetermined pattern, and developing it (that is, a photolithography process).

In recent years, as the detail on semiconductor devices has become finer, the minimum linewidth required for resist patterns has become smaller. From such a background, lasers with short wavelengths, such as KrF, ArF, and the like, have become mainstream as exposure light sources in lithography processes. Furthermore, chemical amplification type photoresist is largely used in association with short wavelength exposure light sources.

This chemical amplification type photoresist is highly reactive to acid and alkali, so there is a possibility of it reacting to a very small quantity of ammonia or the like, for example, thus influencing its characteristics considerably. Therefore, from the point of maintaining its characteristics stably, it is preferable that exposing and developing processing of the chemical amplification type photoresist are performed in a short time in a clean room, in particular, in a clean atmosphere that has passed through a chemical filter or the like.

Therefore, specifically, in a photolithography process in which a chemical amplification type photoresist is used, a so-called in-line resist coating, exposing, and developing apparatus is used in which are incorporated a resist coater for photoresist coating, an exposure apparatus such as a scanner or the like, a baking apparatus for applying heat treatment to the photoresist, a developer for developing, and a carrier device for carrying wafers between the apparatuses.

The in-line resist coating, exposing, and developing apparatus is generally a single wafer processing type apparatus, which is also called a full in-line coating, exposing, and developing apparatus. By using the fill in-line coating, exposing, and developing apparatus, it is possible to form a resist pattern from a chemical amplification type photoresist, for example, within a defined short time. Furthermore, the abovementioned heat treatment process by the baking apparatus is provided for example between the exposure process and the development process. By heat treating after exposure, acid contained in the photoresist is diffused to form a latent image on the resist, and afterwards a resist pattern is formed by developing.

Incidentally, in a multi-product and multistage production line used for manufacturing semiconductor products that require multiple product types and multistage production, depending on the product to be produced and the process, different types of chemical amplification type photoresist are used. For example, there is a case in which semiconductor substrates on which a chemical amplification type photoresist of type "A" (referred to hereunder as "resist A") is coated, and semiconductor substrates on which a chemical amplification type photoresist of type "B" (referred to hereunder as "resist B") is coated, are mixed in the same manufacturing line, and the semiconductor substrates are heat treated one by one in succession by the same baking apparatus.

For example, if after semiconductor substrates (prior lot) on which a resist A is coated are heat treated in a baking apparatus, semiconductor substrates (subsequent lot) on which a resist B is coated are heat treated subsequently in the same baking apparatus, there is a problem in that the linewidth dimension of the resist pattern formed by the resist B becomes larger or smaller than a target dimension due to chemical influence received from the solvent component of the resist A.

FIG. 8 is a graph showing the abovementioned existing problem. FIG. 8 shows the variation of the linewidth dimension of the resist pattern in a subsequent lot after heat treatment of semiconductor substrates (prior lot) on which a resist A is coated, has been completed in a baking apparatus, and the semiconductor substrates (succeeding lot) on which a resist B is coated are subsequently heat treated in the same baking apparatus. The linewidth dimension of the resist pattern formed from the resist B is arranged to be normally within a range (referred to hereunder as "target dimension range") of 80 to 100 [nm].

However, as shown by P in FIG. 8, from the start of the treatment of the succeeding lot after the treatment of the prior lot has been completed until around the sixth wafer (horizontal scale of 6), that is, the semiconductor substrates 1 to 6, there is a tendency for a linewidth dimension of the resist pattern to be out of the target dimension range. Regarding this dispersion in the linewidth dimension, normally there is a tendency for this to be most marked for the semiconductor substrate (horizontal scale of 1) that is treated first by the baking apparatus after the heat treatment of the prior lot is completed, and the dispersion is gradually reduced as the treatment of the succeeding lot progresses.

In this manner, if the linewidth dimension of the resist pattern is far out of the "target dimension range", the etched shape of the film after being etched with this resist pattern as a mask, and the region of ion implanted impurities, vary. As a result, there is concern that the characteristics of the semiconductor device will vary.

Three apparatuses as described hereunder are offered as examples of a post bake apparatus for semiconductor manufacturing with a function of adjusting the exhaust volume.

(1) A hot plate type baking apparatus (for example, refer to Japanese Unexamined Patent Application, First Publication No. H01-225119), which is an apparatus for baking a mask plate on which a resist is coated, or a coating plate such as a wafer, on a hot plate, comprising; a mechanism for discharging inert gas evenly over the surface of the hot plate on which the coating plate is placed, and a gas flow adjustment mechanism for adjusting the gas flow.

(2) A substrate heat treatment apparatus (for example, refer to Japanese Unexamined Patent Application, First Publication No. H07-321023) having; a gas supply device which supplies gas for surface treatment to a heat treatment atmosphere formed around a substrate mounting plate, and an exhaust device for exhausting the gas in the heat treatment atmosphere, wherein there is provided a control device which controls a first opening and closing device provided in the exhaust device such that the gas in the heat treatment atmosphere is exhausted while the substrate is heat treated, and prevents the gas in the heat treatment atmosphere from being exhausted while the substrate is not heat treated.

(3) A semiconductor manufacturing apparatus (for example, refer to Japanese Unexamined Patent Application, First Publication No. 2000-49084), wherein a plate shaped hot plate is located in a heat treatment unit that takes on a closed structure in order to isolate it from the external environment, a straightening vane which controls the exhaust, is located above the semiconductor wafer at a predetermined spacing, and the straightening vane contains one or more holes and an adjuster mechanism for controlling the spacing from the semiconductor wafer.

Each of the documents in which the above-described apparatuses (1) to (3) are described discloses a method for exhausting gas in a heat treatment atmosphere to the outside of the apparatus by the provision of a characteristic method. However, there is no disclosure at all in these documents of a design for dealing with "dispersion between lots" in the linewidth dimension of a resist pattern as described previously. Furthermore, a problem of "dispersion between lots" occurring is not even recognized.

SUMMARY OF THE INVENTION

The present invention takes into consideration the above circumstances, with an object of providing a process for forming a resist pattern, and a resist coating and developing apparatus, which enable dispersion in the linewidth dimension of a resist pattern to be reduced.

A process for forming a resist pattern according to a first aspect of the present invention is a process for forming a resist pattern in which a photoresist is coated on a substrate, the coated photoresist is exposed to light of a predetermined pattern, and afterwards developing is performed, wherein after at least one of the processes of coating, exposing, and developing, whenever lots to which the substrate belongs change, the atmosphere surrounding the substrate is changed.

Using such a construction, even if the types of photoresist coated on a prior substrate, which was treated in the lot prior to a succeeding substrate, and the succeeding substrate are different, whenever the lots are changed, the atmosphere surrounding the photoresist of the succeeding substrate is changed. Therefore, it is possible to perform each step in a process for forming a resist pattern on the succeeding substrate stably without any influence from the photoresist of the prior substrate. As a result, by treating the succeeding substrate after removing the residual elements of the solvent contained in the photoresist of the prior substrate sufficiently, it is possible to form a stable pattern of a photoresist on the succeeding substrate. As a result, the influence on dimensional variation in the lot can be reduced significantly, so that it is possible to prevent the reliability of the semiconductor circuit from being reduced, and the yield from dropping.

A process for forming a resist pattern according to a second aspect of the present invention is a process for forming a resist pattern in which a photoresist is coated on a first substrate, the coated photoresist is exposed to light of a predetermined pattern, and afterwards developing is performed, and comprises the steps of: placing the first substrate on which photoresist is coated in a chamber for heat treatment; comparing the type of photoresist coated on the first substrate and the type of photoresist coated on a second substrate that was heat treated immediately prior to the first substrate in the chamber, and determining whether they are the same or not; changing the atmosphere in the chamber in the case where it is determined in the determining step that the type of photoresist on the first substrate and the type of the photoresist on the second substrate are not the same; and applying heat treatment to the first substrate in the chamber after the changing step.

According to such a construction, it is determined whether the types of photoresist coated on the second substrate (prior substrate) and the first substrate (succeeding substrate) are the same or not. In the atmosphere changing step that follows, the process of changing the atmosphere in the chamber is performed only in cases where required, based on the determination result, and afterwards it is possible to perform heat treatment on the first substrate in the chamber in the heat treatment step. Therefore, heat treatment of the resist pattern is applied to the first substrate (succeeding substrate) stably with no influence from the photoresist of the second substrate (prior substrate). By treating the first substrate (succeeding substrate) after removing the residual ingredients of the solvent contained in the photoresist of the prior substrate sufficiently, it is possible to form a stable photoresist pattern on the first substrate (succeeding substrate). As a result, it is possible to reduce the influence on the dimensional variation in the lot significantly, and thus it is possible to prevent the reliability of the semiconductor circuit from being reduced, and the yield from dropping. Furthermore, since the atmosphere in the chamber is changed by the minimum required, a process is established in which the temperature of the atmosphere in the chamber and the like are maintained more stably. As a result, it is possible to obtain a process for forming a resist pattern that enables energy saving and reduced cost in the manufacturing process.

A resist coating and developing apparatus according to a third aspect of the present invention is a resist coating and developing apparatus for coating photoresist on a first substrate, exposing the coated photoresist to light of a predetermined pattern, and afterwards developing it to form a resist pattern, wherein there are provided: a chamber for heat treatment, which accommodates the first substrate on which the photoresist is coated; a discharge section which discharges gas in the chamber to the outside of the chamber; a plurality of bypass lines provided with valves which adjust the flow rate, and which interconnect with the chamber; and a first exhaust adjustment section which changes the number of bypass lines used by opening and closing the valves, in response to the results of a comparison of the characteristics of a second substrate that was heat treated in the chamber immediately prior to the first substrate and the characteristics of the first substrate, to control the exhaust flow rate, so that the atmosphere in the chamber is changed.

According to such a construction, it is possible to change the number of bypass lines to be used by the first exhaust adjustment section appropriately, based on the results of a comparison of the first substrate and the second substrate that was heat treated immediately prior, in order to control the exhaust flow rate. As a result, it is possible to obtain a resist coating and developing apparatus that can rapidly change the atmosphere in the chamber by only the minimum amount required.

A resist coating and developing apparatus according to a fourth aspect of the present invention is a resist coating and developing apparatus for coating a photoresist on a first substrate, exposing the coated photoresist to light of a predetermined pattern, and afterwards developing it to form a resist pattern, wherein there are provided: a chamber for heat treatment, which accommodates a first substrate on which the photoresist is coated; a discharge section which discharges gas in the chamber to the outside of the chamber; a top plate which is placed inside the chamber and which has apertures for regulating the air stream flowing into the chamber; and a second exhaust adjustment section which changes the atmosphere in the chamber by controlling the internal diameters of the apertures in response to the results of a comparison of the characteristics of a second substrate that was heat treated in the chamber immediately prior to the first substrate and the characteristics of the first substrate.

According to such a construction, it is possible to control the apertures of the air stream regulation top plate appropriately by the second exhaust adjustment section based on the results of a comparison of a first substrate and a second substrate that was heat treated immediately prior. As a result, it is possible to obtain a resist coating and developing apparatus that can rapidly change the atmosphere in the chamber by only the minimum amount required.

DETAILED DESCRIPTION OF THE INVENTION

Hereunder is a description of a first embodiment of a process for forming a resist pattern, and a resist coating and developing apparatus, according to the present invention, with reference to the drawings. The embodiments described below do not limit the present invention unless specified explicitly.

(1) First Embodiment

Figure 2:
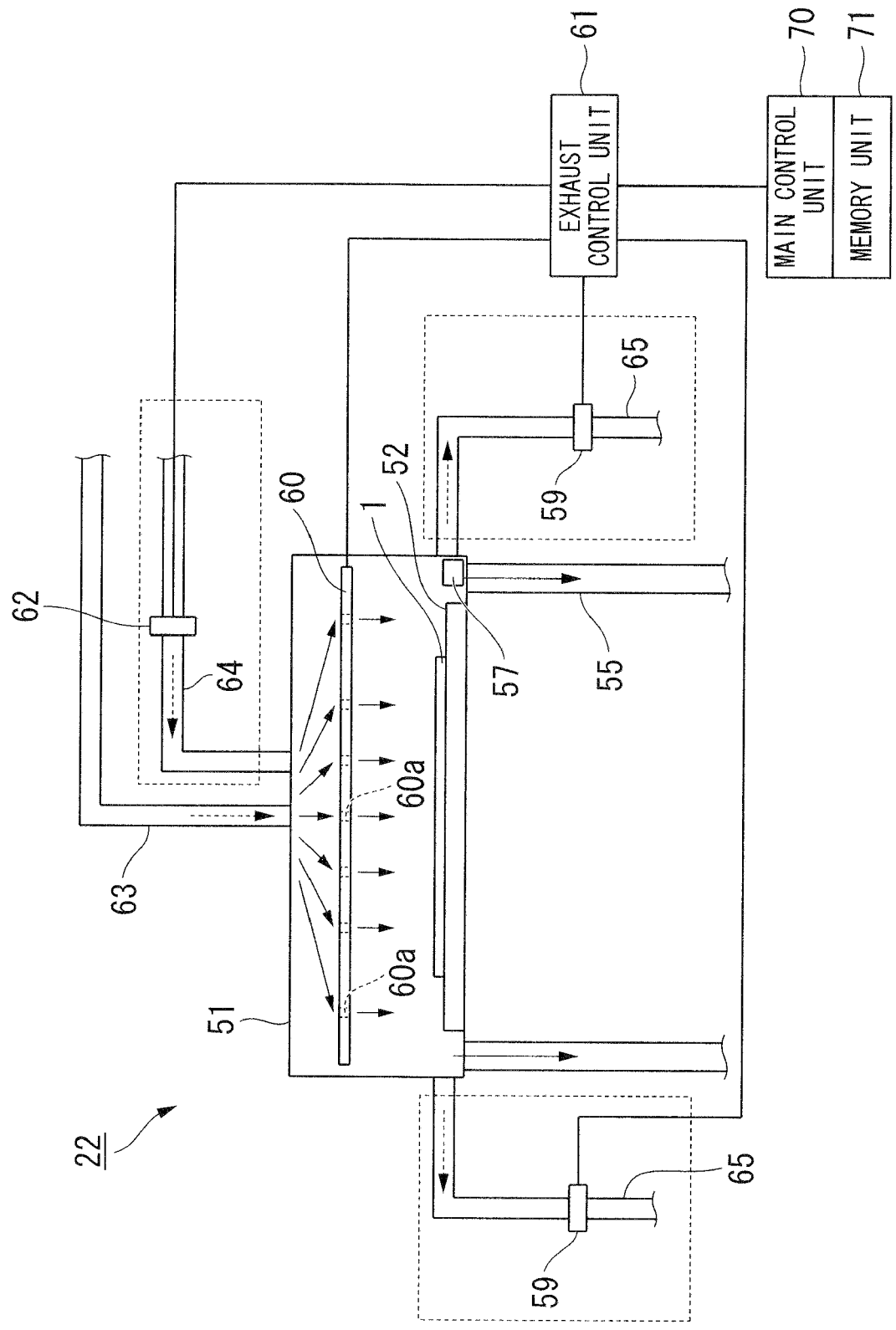
FIG. 2 is a structural diagram showing the fourth baking apparatus shown in FIG. 1.

In a process for forming a resist pattern according to a first embodiment, the present invention is used as a method of performing a forced exhaust in a fourth baking apparatus 22 as shown in FIG. 2.

Figure 1:
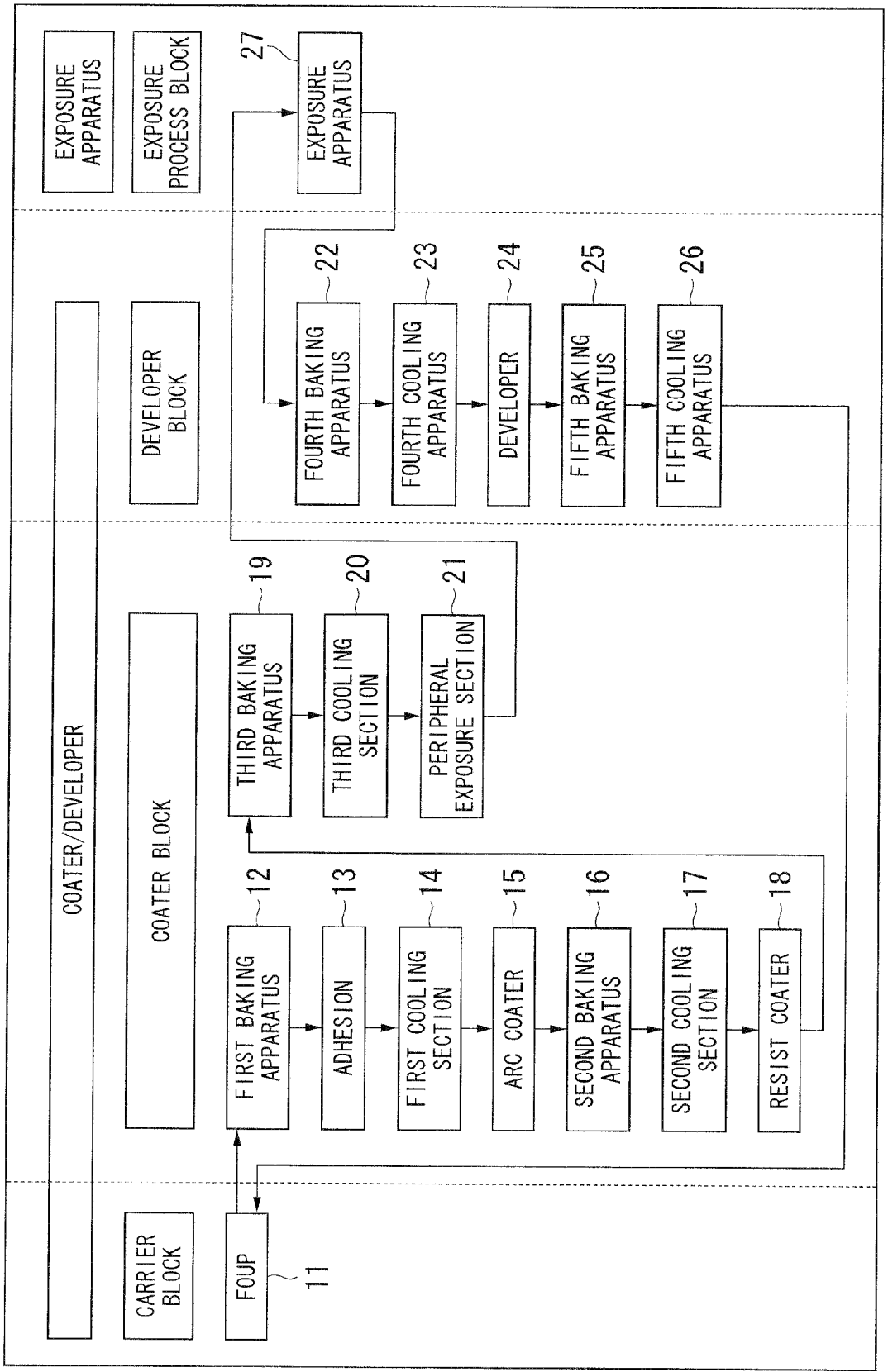
FIG. 1 is a block diagram showing a full in-line coating, exposing, and developing apparatus according to embodiments of the present invention.

FIG. 1 is a block diagram showing a fill in-line coating, exposing, and developing apparatus 100 according to the present invention. The full in-line coating, exposing, and developing apparatus 100 is an example in which a semiconductor substrate is used as a substrate. It is a single-wafer processing type apparatus that applies a chemical amplification type photoresist (referred to hereunder as simply "resist") on a wafer made from silicon or the like, for example, and exposes and develops it consecutively in a short period.

As shown in FIG. 1, this full in-line coating, exposing, and developing apparatus 100 comprises; a carrier block, a coater block, an exposure apparatus process block, a developer block, and a carrier device that carries a semiconductor substrate 1 between the blocks and within each of the blocks in the order shown by the arrows of FIG. 1.

The carrier block is provided with; a stage on which a wafer carrier (FOUP—Front Opening Unified Pod) 11 capable of storing a lot consisting of 25 wafers of semiconductor substrates 1, for example, is mounted, a loader that loads the semiconductor substrates into the carrier device one by one, an unloader that receives the semiconductor substrates from the carrier device one by one, and the like. Furthermore, the coater block is provided with a first baking apparatus 12, an adhesion section 13, a first cooling section 14, an ARC (Anti-Reflection Coating) coater 15, a second baking apparatus 16, a second cooling section 17, a resist coater 18, a third baking apparatus 19, a third cooling section 20, and a peripheral exposure section 21.

The first baking apparatus 12 constituting the coater block heats the semiconductor substrates up to 180° C. to 200° C., for example, and sublimates moisture on the semiconductor substrates in order to improve the adhesiveness between the semiconductor substrates and the resist. The first baking apparatus 12 comprises a chamber, a hot plate provided in the chamber, and the like. The semiconductor substrates are heated one by one on the hot plate.

The adhesion section 13 sprays HMDS (hexamethyl disilazane) as a mist on the surfaces of the semiconductor substrates to give a hydrophobic treatment to the surfaces of the semiconductor substrates. In the hydrophobic treatment, the semiconductor substrates are heated up to approximately 110° C. to 130° C., for example. Furthermore, the first cooling section 14 cools the semiconductor substrates heated in the adhesion section 13 to a normal temperature of approximately 23° C., for example. The first cooling section 14 comprises a cooling plate and the like. The semiconductor substrates are cooled one by one on the cooling plate. Moreover, the ARC coater 15 drops a reflection prevention film on the semiconductor substrates, and rotates the semiconductor substrates at a high speed to spread the reflection prevention film thinly on the semiconductor substrates.

The second baking apparatus 16 heats the semiconductor substrates up to 170° C. to 220° C., for example, in order to volatize the solvent and the like of the reflection prevention film that is coated on the wafer. The second baking apparatus 16 comprises a chamber, a hot plate, and the like, similarly to the first baking apparatus 12, and the semiconductor substrates are heated one by one on the hot plate.

The second cooling section 17 comprises a cooling plate, and the like, similarly to the first cooling section 14. The semiconductor substrates are cooled one by one on the cooling plate. The resist coater 18 drops resist on the semiconductor substrates, and rotates the semiconductor substrates at a high speed to spread the resist thinly on the semiconductor substrates.

The third baking apparatus 19 heats the semiconductor substrates up to 90° C. to 140° C., for example, in order to volatize the solvent and the like of the resist that is coated on the wafer. The third baking apparatus 19 comprises a chamber, a hot plate, and the like, similarly to the first baking apparatus 12, and the semiconductor substrates are heated one by one on the hot plate.

The third cooling section 20 comprises a cooling plate, and the like, similarly to the first cooling section 14. The semiconductor substrates are cooled one by one on the cooling plate. The peripheral exposure section 21 registers numbers on the semiconductor substrates, and also exposes only the periphery of the semiconductor substrates so that resist is prevented from attaching to the carrier device or other equipment.

The exposure apparatus process block shown in FIG. 1 is provided with an exposure apparatus 27 such as a scanner or the like, for example. The developer block shown in FIG. 1 is provided with a fourth baking apparatus 22, a fourth cooling section 23, a developer 24, a fifth baking apparatus 25, and a fifth cooling section 26.

The fourth baking apparatus 22 heats the semiconductor substrates up to 90° C. to 140° C., for example, in order to disperse the acid of the exposed parts by a heat reaction. The fourth baking apparatus 22 comprises a chamber, a hot plate, and the like, similarly to the first, second, and third baking apparatuses, and the semiconductor substrates are heated one by one on the hot plate. The detail of the fourth baking apparatus 22 is described later with reference to FIG. 2.

The fourth cooling section 23 cools the semiconductor substrates heated by the fourth baking apparatus to a normal temperature of 22° C. to 23° C., for example. The fourth cooling section 23 comprises a cooling plate, and the like, similarly to the first, second, and third cooling sections. The semiconductor substrates are cooled one by one on the cooling plate.

The developer 24 is an apparatus that drops developing solution on the semiconductor substrates that have been exposed and had heat treatment performed after being coated with resist to form a resist pattern, and subsequently cleans the resist pattern with pure water (that is, a pure water rinse).

The fifth baking apparatus 25 heats the resist pattern formed on the semiconductor substrates up to 90° C. to 120° C., for example, in order to bake and solidify it. The fifth baking apparatus 25 comprises a chamber, a hot plate, and the like, similarly to the first to fourth baking apparatuses, and the semiconductor substrates are heated one by one on the hot plate. The fifth cooling section 26 cools the semiconductor substrates heated by the fifth baking apparatus 25 to a normal temperature of approximately 23° C., for example. The fifth cooling section 26 comprises a cooling plate, and the like, similarly to the first to fourth cooling sections. The semiconductor substrates are cooled one by one on the cooling plate.

The fill in-line coating, exposing, and developing apparatus 100 is provided with a main control 70 (refer to FIG. 2), which controls the semiconductor substrate processing in each piece of equipment in the abovementioned blocks, and the carrying operations by the carrier device, and manages the statuses of the semiconductor substrates (lots) during processing or waiting in each of the apparatuses. The main control unit 70 is connected to a memory unit 71 (refer to FIG. 2) and the like, and stores the lot numbers of the wafers during processing or waiting in the full in-line coating, exposing, and developing apparatus 100, and information regarding the types of resist dropped on the semiconductor substrates. The information can be read out by the main control unit 70 at any time, and can be written.

FIG. 2 is a concept diagram showing a structural example of the fourth baking apparatus 22. As shown in FIG. 2, the fourth baking apparatus 22 has a chamber 51 for heating. The chamber 51 is connected to a purge line 63 which supplies a constant flow of inert gas such as N2 or the like to the chamber 51, and an exhaust pipe 55, one end of which is connected to the chamber 51, and the other end of which is connected to the exhaust system of a factory. A flow rate sensor 57 is provided in order to measure the flow rate of the exhaust gas (referred to hereunder as "exhaust flow rate") in the exhaust pipe 55. The chamber 51 is furthermore connected to a plurality of exhaust bypass lines 65, and a purge bypass line 64. The exhaust bypass lines 65 are provided with control dampers 59 which adjust the exhaust flow rate. The purge bypass line 64 is provided with a control valve 62 which controls the purge amount of nitrogen (N2) supplied to the chamber 51. The exhaust control unit 61 is connected to the control dampers 59 and the control valve 62, and controls them under the control of the main control unit 70.

The chamber 51 is a processing chamber for storing and heating a semiconductor substrate 1 on which resist is coated. The chamber 51 is provided with a hot plate 52 containing a heater inside. Furthermore, on the upper part of the chamber 51 is placed a top plate 60 having a plurality of apertures 60a for regulating the gas stream (shown by arrows in the figure) supplied from the purge line 63 and the purge bypass line 64. It is possible to increase and decrease the internal diameters of the apertures 60a under control of the exhaust control unit 61.

The exhaust control unit 61 controls the exhaust flow rate by adjusting the opening of the control dampers 59 and also adjusting the control valve 62, which adjusts the purge flow rate, based on information regarding the flow rate obtained from the exhaust flow rate sensor 57, and selected information from the main control unit 70, which controls the fill in-line coating, exposing, and developing apparatus 100. The selected information from the main control unit 70 is described later. The semiconductor substrate 1 on which resist is coated is placed in the chamber 51, and mounted on the hot plate 52 for heating. As a result, solvent parts and the like contained in the resist evaporate in the chamber 51. The evaporated solvent parts and the like pass through the exhaust pipe 55, and are discharged outside of the full in-line coating, exposing, and developing apparatus, that is, to the exhaust system of a factory.

Next is a description of a method for forming a resist pattern on the semiconductor substrate 1 using the full in-line coating, exposing, and developing apparatus. Firstly, a FOUP 11 in which a lot comprising 25 wafers of semiconductor substrates, for example, is accommodated is mounted on the stage of the carrier block. Next, the semiconductor substrates 1 accommodated in the FOUP 11 are mounted on the carrier device by a loader one by one. Hereunder, it is assumed that the semiconductor substrates 1 are processed as single wafers by each piece of equipment in the blocks one by one in the order of the arrows of FIG. 1.

Firstly, a semiconductor substrate 1 is heated up to 180° C. to 200° C. by a first baking apparatus 12 of the coater block to sublimate the moisture on the semiconductor substrate 1. Next, HMDS is sprayed as a mist on the surface of the semiconductor substrate 1 by the adhesion section 13, as hydrophobic treatment of the surface of the semiconductor substrate 1. Furthermore, the semiconductor substrate 1 is cooled to a normal temperature of approximately 23° C. by the first cooling section 14. Then, a thin reflection prevention film is formed on the semiconductor substrate 1 by the ARC coater 15.

Next, the semiconductor substrate 1 is heated up to 170° C. to 220° C. to evaporate the solvent and the like of the ARC coated on the semiconductor substrate 1 by the second baking apparatus 16. Afterwards, the semiconductor substrate 1 is cooled to a normal temperature of approximately 23° C. by the second cooling section 17.

Then, a thin resist film is formed on the semiconductor substrate 1 by the resist coater 18. The semiconductor substrate 1 is heated up to 90° C. to 130° C. by the third baking apparatus 19 to evaporate the solvent and the like of the resist coated on the semiconductor substrate 1 (pre-bake). Afterwards, the semiconductor substrate 1 is cooled to a normal temperature of approximately 23° C. by the third cooling section 20. Then, only the periphery of the semiconductor substrate 1 is exposed by the peripheral exposure section 21.

Next, the resist coated on the semiconductor substrate is exposed to light of a predetermined pattern by the exposure apparatus 27 in the exposure apparatus process block. Then, it is heated at approximately 90° C. to 120° C., for example, by the fifth baking apparatus 25 of the developer block to disperse the acid of the exposed part (post bake).

Figures 3, 4:
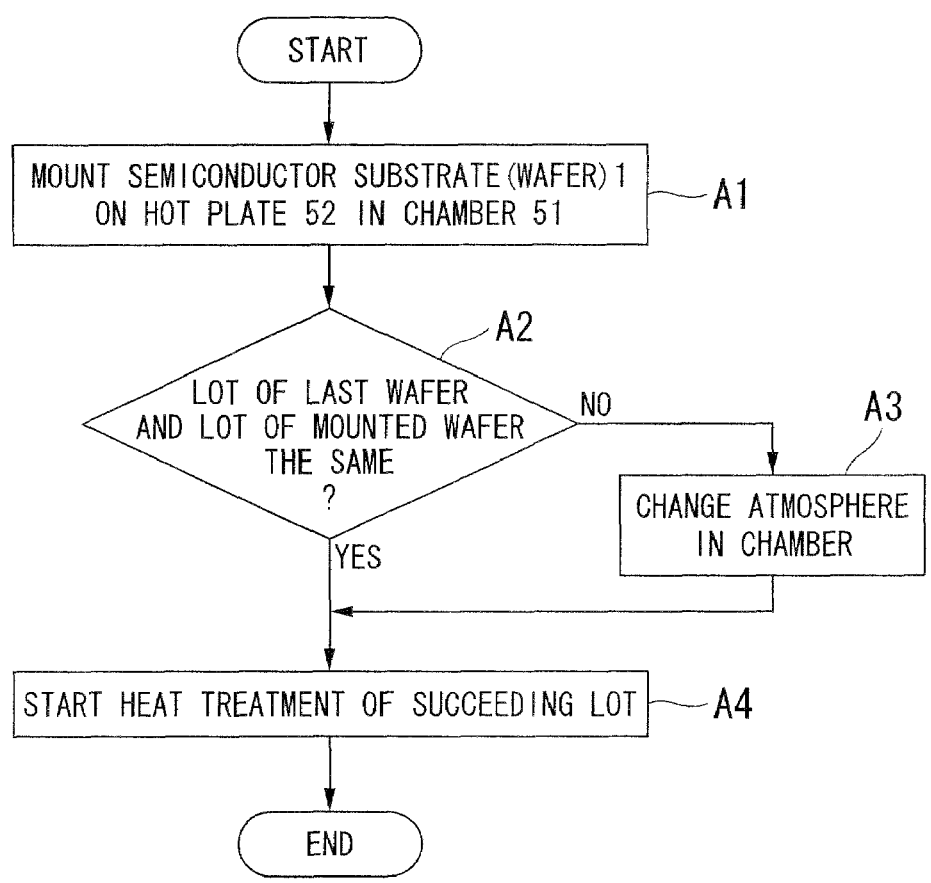
FIG. 3 is a diagram showing an example of the influence on the linewidth dimension of a resist pattern in several combinations of resist groups A, B, C and D in the embodiments of the present invention.
FIG. 4 is a flow chart showing a post bake processing method according to a first embodiment of the present invention.

FIG. 4 is a flow chart showing the processing method of the post bake associated with the embodiments of the present invention. In the post bake, firstly, a semiconductor substrate 1 is placed in the chamber 51 of the fourth baking apparatus shown in FIG. 2, and the semiconductor substrate 1 is mounted on the hot plate 52 (step A1). Next, it is determined by the main control unit 70 whether the lot to which the semiconductor substrate that was last heat treated (referred to hereunder as "last wafer") belonged, and the lot to which the wafer placed in the chamber 51 belongs, are the same or not (step A2). This is determined based on the information stored in the memory unit 71.

In the case where it is determined in step A2 that the lot to which the last wafer belonged and the lot to which the wafer 1 placed in the chamber 51 belongs are not the same, that is, in the case where it is determined that the lot has changed from the previous post bake, the flow proceeds to step A3.

In step A3, a predetermined signal is transmitted from the main control unit 70 to the exhaust control unit 61, and on receiving this signal, the exhaust control unit 61 opens the control valve 62 and the control dampers 59 widely for only a defined time. In this manner, the exhaust flow rate from the exhaust pipe 55 and the two exhaust bypass lines 65 increases, and thus the atmosphere in the chamber 51 is forced to be changed.

The exhaust control unit 61 might open the control damper 59 of only one of the two exhaust bypass lines 65 depending on the desired exhaust flow rate. In this case, the gas in the chamber 51 is exhausted by one exhaust bypass line 65 and the exhaust pipe 55.

After the atmosphere in the chamber 51 has been changed, the flow proceeds to step A4. In step A4, the wafer 1 that is mounted on the hot plate is heated up to 90° C. to 130° C. for example, to disperse the acid in parts depending on whether they are exposed or not. In this manner, the flow chart shown in FIG. 4 terminates.

Figure 6:
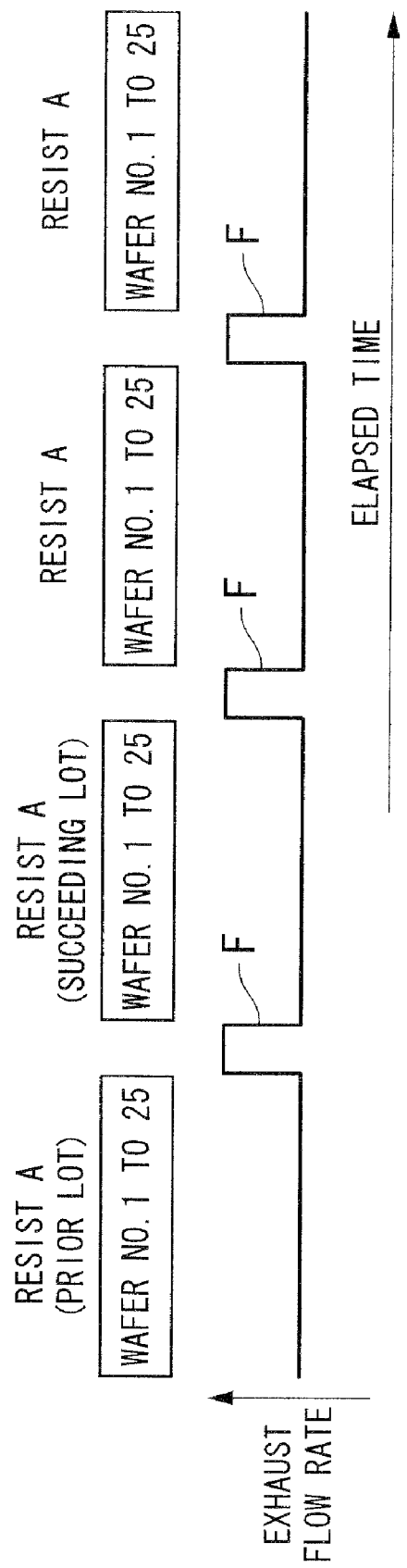
FIG. 6 is a diagram showing the timing of a forced exhaust according to the first embodiment of the present invention.

By the above processing, as shown in FIG. 6, a forced exhaust F of the chamber 51 is performed each time bake processing of one lot comprising 25 wafers is performed in the fourth baking apparatus 22.

Returning to FIG. 1, the semiconductor substrate 1 is cooled to a normal temperature of approximately 23° C. by the fourth cooling section 23. Next, a developing solution is applied to the resist on the semiconductor substrate 1 to form a resist pattern by the developer 24, and the resist pattern is rinsed with pure water. Then, the semiconductor substrate 1 is cooled to a temperature of approximately 90° C. to 120° C., for example, by the fifth baking apparatus 25. Furthermore, the semiconductor substrate 1 is carried to a carrier stage by a carrier device. Afterwards, the semiconductor substrate 1 is placed in the FOUP 11 by an unloader.

In this manner, in a process for forming a resist pattern according to the first embodiment of the present invention, the atmosphere in the chamber 51 is always changed (that is, a forced purge or forced exhaust) when changing the lot in a post bake step for dispersing acid in parts depending on whether they are exposed or not by a heat reaction. Accordingly, it is possible to reduce the dispersion in the amount of diffused acid depending on whether exposed or not, in the first plurality of wafers of the succeeding lot in a post bake, while minimizing the change in the temperature of the chamber 51, thus enabling the dispersion in the linewidth dimension of the resist pattern to be reduced.

(2) Second Embodiment

Figure 5:
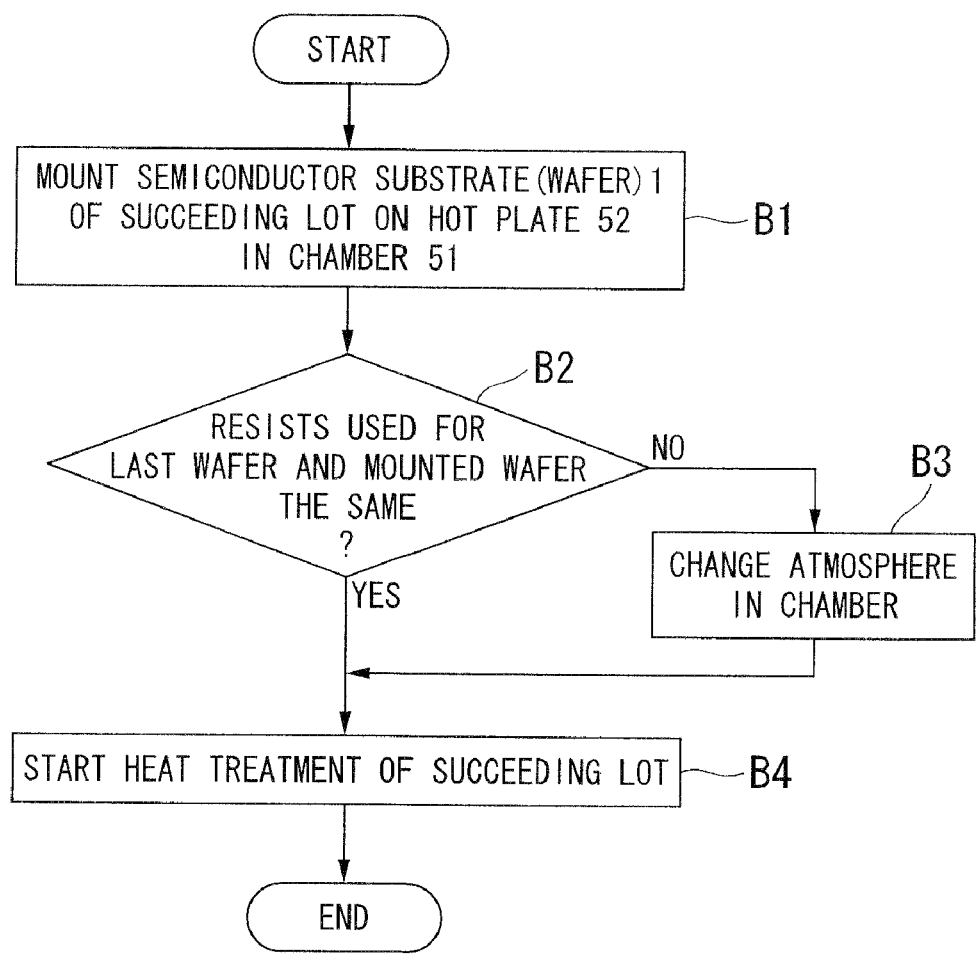
FIG. 5 is a flow chart showing a post bake processing method according to a second embodiment of the present invention.

FIG. 5 is a flow chart showing a post bake processing method according to a second embodiment of the present invention. In the second embodiment, the forced exhaust of the fourth baking apparatus 22 shown in FIG. 2 is performed not when changing lots, but when changing the type of photoresist. The other structures (that is the structure of the fill in-line coating, exposing, and developing apparatus 100, the structure of the fourth baking apparatus, and the like) are the same as those in the first embodiment.

In the post bake in the second embodiment, firstly, a semiconductor substrate 1 is placed in the chamber 51 of the fourth baking apparatus 22, and the semiconductor substrate 1 is mounted on the hot plate 52 (step B1). Next, it is determined by the main control unit 70 whether the type of resist on the semiconductor substrate that was last heat treated in the chamber 51 (last wafer), and the type of resist coated on the substrate 1 placed in the chamber 51, are the same or not. This is determined based on information stored in the memory unit 71.

In the case where it is determined in step B2 that the resist on the last wafer and the resist coated on the semiconductor substrate 1 placed in the chamber 51 are of the same type, the atmosphere in the chamber 51 is not changed, and the flow proceeds to step B4. Furthermore, in the case where it is determined that the resist on the last wafer and the resist coated on the semiconductor 1 placed in the chamber 51 are not of the same type, the flow proceeds to step B3.

In step B3, a predetermined signal is transmitted from the main control unit 70 to the exhaust control section 61, and on receiving this signal, the exhaust control section 61 opens the control dampers 59 widely for only a defined time, and also opens the control valve 62 of the purge bypass line 64 widely. In this manner, the exhaust flow rate from the exhaust pipe 55 and the exhaust bypass lines 65 increases, and thus the atmosphere in the chamber 51 is changed. After the atmosphere in the chamber 51 has changed sufficiently, the flow proceeds to step B4. In step B4, the semiconductor substrate 1 mounted on the hot plate 52 is heated up to 90° C. to 130° C. to disperse acid in parts depending on whether they are exposed or not. In this manner, the flow chart shown in FIG. 5 terminates.

Figure 7:
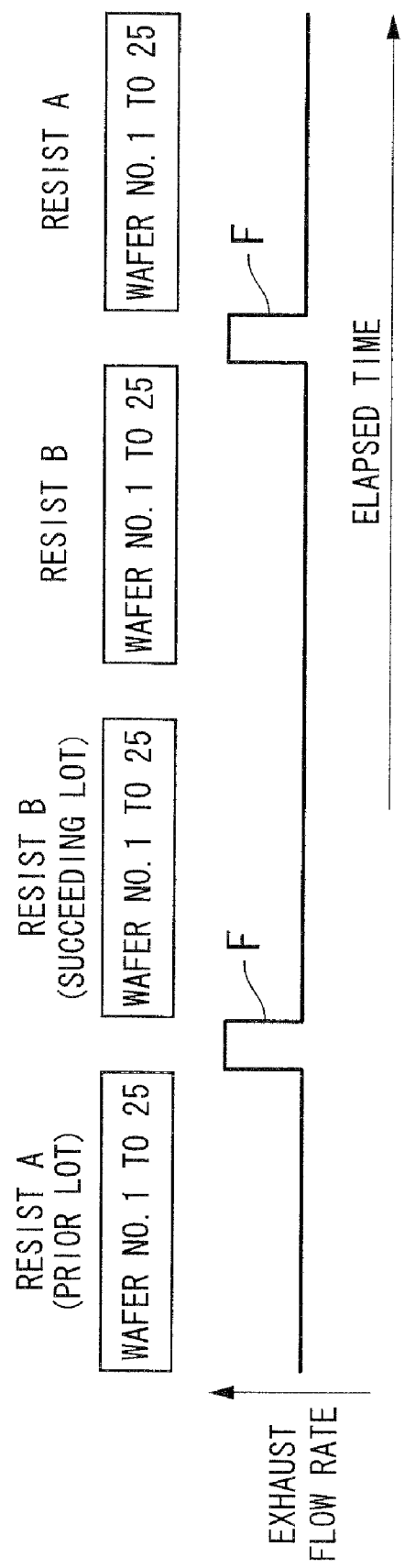
FIG. 7 is a diagram showing the timing of a forced exhaust according to the second embodiment of the present invention.
Figure 8:
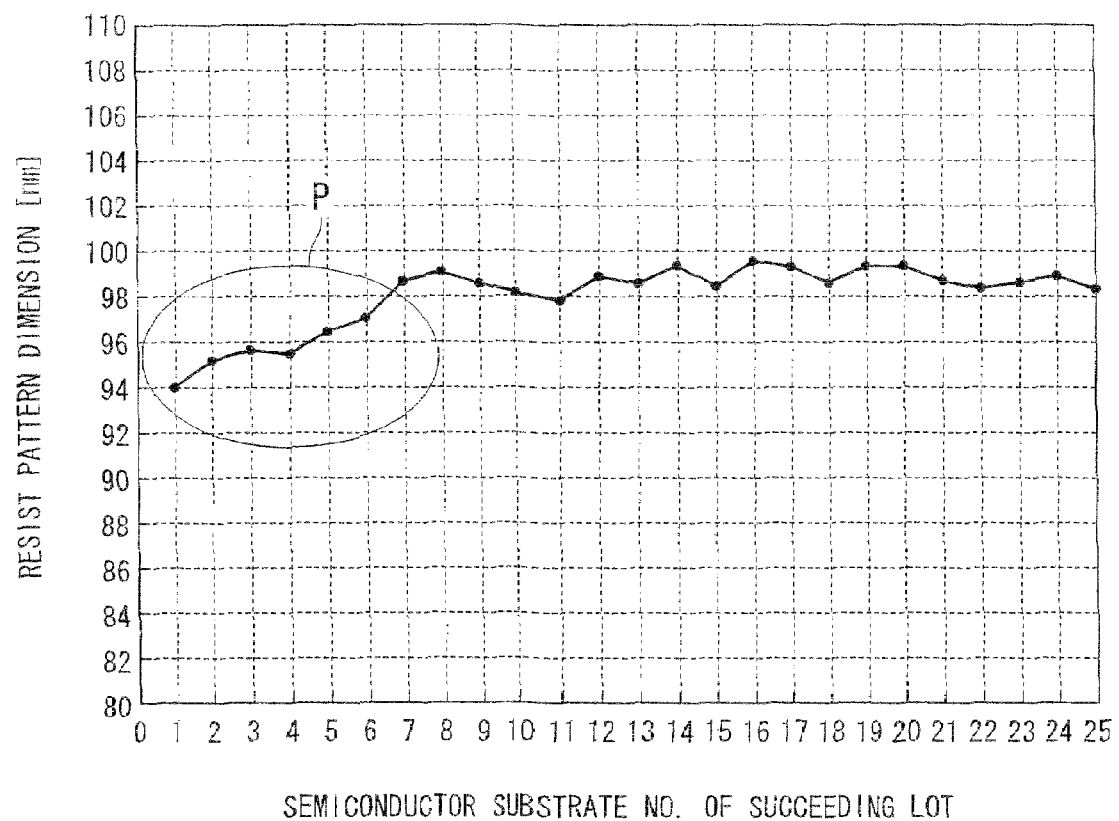
FIG. 8 is a graph showing variation in the linewidth of a resist pattern in a conventional example.

By the above processing, as shown in FIG. 7, after baking of one lot comprising 25 wafers has been performed in the fourth baking apparatus 22, in the case where processing of a succeeding lot using a different resist is performed, a forced exhaust F of the chamber 51 is performed. In the case where the succeeding lot uses the same resist as the prior lot (in the case where consecutive lots use resist B), a forced exhaust of the chamber 51 is not performed prior to baking the succeeding lot.

In this manner, in a process for forming a resist pattern according to the second embodiment of the present invention, the atmosphere in the chamber 51 is changed when the type of resist used on the semiconductor substrates 1 is changed.

As shown in FIG. 3, some of the combinations of types of resist have no influence on the resist pattern in the succeeding lot. For example, in the case where the prior lot uses resist A, and the succeeding lot uses resist B, the resist B is influenced by the solvent component of resist A. However, in the case where the succeeding lot uses resist C or D, resist C or D is not influenced. Similarly, in the case where the prior lot uses resist B, and the succeeding lot uses resist D, resist D is not influenced. Therefore, it is possible to only change the atmosphere in the chamber 51 when the type of the resist is changed from resist A to resist B, and when it is changed from resist B to resist C. As a result, it is possible to reduce the dispersion in the linewidth dimension of the resist pattern due to heat treatment of the succeeding lot while keeping the change in temperature in the chamber 51 as low as possible.

Furthermore, the arrangement may be such that during the change of the atmosphere in the chamber 51, the exhaust control unit 61 enlarges the internal diameters (that is, enlarges the opening spaces) of the air stream regulation top plate 60. In this case, the resistance of the air stream flowing into the chamber 51 decreases so that it is possible to further increase the exhaust volume.

By adopting any one of the processes for forming a resist pattern described in the first and second embodiments in the manufacturing process of a desired semiconductor manufacturing device, it is possible to reduce the dispersion in the etched shape and size of the film after being etched with the resist pattern as a mask, and the shape and size of the region after conductive impurities have been ion implanted in it.

Furthermore, in the first and second embodiments, the case is described in which a process for forming a resist pattern of the present invention is used in the post bake step in the fourth baking apparatus 22. However, the application of the present invention is not limited to this. For example, the process for forming a resist pattern of the present invention may be used in the pre-bake step in the third baking apparatus 19. In this case also, it is possible to control the dispersion in the linewidth dimension of the resist pattern due to heat treatment, in the first plurality of wafers of the succeeding lot while keeping the change in temperature in the chamber as low as possible.

In the above-described first and second embodiments, the "chemical amplification type photoresist" corresponds to the photoresist in the invention, and the in-line coating, exposing, and developing apparatus 100 corresponds to the in-line coating, exposing, and developing apparatus of the present invention. Moreover, the semiconductor substrate 1 corresponds to the first substrate (succeeding substrate) of the succeeding lot of the present invention, and the last wafer corresponds to the second substrate (prior substrate) of the prior lot of the present invention. Furthermore, the chamber 51, the exhaust pipe 55, and the exhaust control unit 61, correspond respectively to the heat treatment chamber of the present invention, the exhaust section of the present invention, and the exhaust adjustment section of the present invention.

Moreover, in the above-described first and second embodiments, a specific example is described in which the substrates are semiconductor substrates. However, the present invention is not limited to a semiconductor substrate. For example, the process for forming a resist pattern, and the resist coating and developing apparatus according to the present invention are also effective for a substrate made of other materials such as glass, plastic, ceramic or the like, or a substrate of a stack of a semiconductor substrate and such a substrate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A process for forming a resist pattern in which a photoresist is coated on a substrate, the coated photoresist is exposed to light of a predetermined pattern, and afterwards developing is performed on the exposed pattern, wherein
    after at least one of said processes of coating, exposing, and developing, whenever lots to which said substrate belongs change, the atmosphere surrounding said substrate is changed at a desired exhaust flow rate, which is controlled by changing a number of bypass lines for exhaust flow, and heat treatment is performed on said substrate.

2. A process for forming a resist pattern in which a photoresist is coated on a first substrate, the coated photoresist is exposed to light of a predetermined pattern, and afterwards developing is performed on the exposed pattern, comprising the steps of:
    placing a plate in a chamber for heat treatment, said plate having a plurality of apertures;
    placing said first substrate on which photoresist is coated in said chamber;
    comparing the type of photoresist coated on said first substrate and the type of photoresist coated on a second substrate that was heat treated immediately prior to said first substrate in said chamber, and determining whether they are the same or not;
    changing the atmosphere in said chamber by controlling internal diameters of the apertures in the case where it is determined in said determining step that the type of photoresist on said first substrate and the type of the photoresist on said second substrate are not the same; and
    applying heat treatment to said first substrate in said chamber after said changing step.

3. A resist coating and developing apparatus for coating a photoresist on a first substrate, exposing the coated photoresist to light of a predetermined pattern, and afterwards developing said pattern to form a resist pattern, wherein there are provided:
    a chamber for heat treatment, which accommodates the first substrate on which said photoresist is coated;
    a discharge section which discharges gas in said chamber to the outside of said chamber;
    a plurality of bypass lines provided with valves which adjust the flow rate, and which interconnect with said chamber; and
    a first exhaust adjustment section, which uses said bypass lines by opening and closing the valves, in response to the results of a comparison of the characteristics of a second substrate that was heat treated in said chamber immediately prior to said first substrate and the characteristics of said first substrate, to increase the exhaust flow rate, and change the atmosphere in said chamber,
    wherein control of the exhaust flow rate is performed by changing the number of said bypass lines used by said a first exhaust adjustment section.

4. A resist coating and developing apparatus for coating a photoresist on a first substrate, exposing the coated photoresist to light of a predetermined pattern, and afterwards developing said pattern to form a resist pattern, wherein there are provided:
    a chamber for heat treatment, which accommodates a first substrate on which said photoresist is coated;
    a discharge section which discharges gas in said chamber to the outside of said chamber;
    a top plate which is placed inside said chamber and which has apertures for regulating the air stream flowing into said chamber; and a second exhaust adjustment section which changes the atmosphere in said chamber by controlling the internal diameters of said apertures in response to the results of a comparison of the characteristics of a second substrate that was heat treated in said chamber immediately prior to said first substrate and the characteristics of said first substrate.

* * * * *